(12) United States Patent
Blodgett et al.

(10) Patent No.: US 6,565,382 B1
(45) Date of Patent: May 20, 2003

(54) CORE MOUNTING ASSEMBLY AND CLAMP THEREFOR

(75) Inventors: William M. Blodgett, Shirley, MA (US); Richard E. Olson, Rindge, NH (US); Raoji A. Patel, Framingham, MA (US)

(73) Assignee: Hewelett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/021,510

(22) Filed: Dec. 7, 2001

(51) Int. Cl.⁷ ............................................. H01R 13/73
(52) U.S. Cl. ...................................... 439/547; 336/200
(58) Field of Search ................... 439/547, 73; 338/200, 338/223, 232, 197, 196

(56) References Cited

U.S. PATENT DOCUMENTS 5,289,153 A * 2/1994 Gross ......................... 336/210
6,326,875 B1 * 12/2001 Tuovinen ..................... 336/197

* cited by examiner

*Primary Examiner*—Renee Luebke
*Assistant Examiner*—Ann McCamey
(74) *Attorney, Agent, or Firm*—Cesari & McKenna, LLP

(57) ABSTRACT

A core mounting assembly includes a printed wiring board having a substrate with opposite sides, a winding on one side and a plurality of through holes extending through the substrate adjacent to the winding. A pair of mirror-image core sections are positioned against the sides of the board opposite the first winding, the core sections having corresponding portions which project into the through holes. A bracket has a back portion engaging one of the core sections and at least two legs extending from the back portion through two of the through holes in the board. A resilient cover member has a first end releasably secured to one of the legs, a second end releasably secured to the other of the legs and a bridging portion extending between the first and second ends and pressing against the other of the core sections so as to bias the core sections together.

7 Claims, 1 Drawing Sheet

CORE MOUNTING ASSEMBLY AND CLAMP THEREFOR

BACKGROUND OF THE INVENTION

1. Field of the Invention

This invention relates to apparatus for securing a transformer or choke core to a printed wiring board (PWB) and to the core mounting assembly itself.

2. Background Information

Voltage regulators and other electrical circuits for computers and the like often have integrated transformers, chokes and other inductive elements on the PWB. These elements usually consist of "windings" in the form of conductive paths printed or laid down on the PWB and a ferromagnetic core, usually of ferrite, mounted to the PWB. Optimum performance requires that the core be maintained close to the windings on the PWB.

Typically the ferromagnetic cores with which we are concerned consist of two mirror image core sections which are positioned on opposite sides of the PWB and are brought together through appropriately shaped through holes in the PWB so that one or both of the core sections is positioned close to the windings on the board. Currently that assembly is done by hand. The assembler must hold the two core sections together from opposite sides of the PWB while applying tape or glue to those parts. The assembler must then press one core section against a side of the board carrying the winding while applying adhesive to hold the core sections in the correct position. Usually, the adhesive is an epoxy material which takes time to cure. Therefore, the assembler must hold the parts together for several minutes to be sure that the adhesive has set completely. This obviously decreases the throughput of the manufacturing line for the voltage regulators and other circuits on printed wiring boards having such integral cores. Also, the assembler does not always hold the core sections together in the same way from board to board while the adhesive sets. Resultantly, the gap between the two core sections is not consistent from unit to unit which adversely affects the electrical performance of the circuit on the PWB and lowers the overall product yield.

The prior assemblies are disadvantaged also because the adhered core section cannot be separated in the event repair or replacement becomes necessary. Also, the adhesive or glue can separate over time resulting in circuit failure.

SUMMARY OF THE INVENTION

Accordingly it is an object of the present invention to provide an improved transformer or choke core mounting assembly. Another object of the invention is to provide an assembly of this type which is relatively easy to implement.

A further object of the invention is to provide such an assembly which results in consistent performance from unit to unit.

A further object of the invention is to provide an improved clamp assembly for mounting a transformer or choke core to a printed wiring board.

Another object of the invention is to provide such a clamp assembly which is relatively easy and inexpensive to manufacture.

Other objects will, in part, be obvious and will, in part, appear hereinafter.

The invention accordingly comprises the features of construction, combination of elements and arrangement of parts which will be exemplified in the following detailed description, and the scope of the invention will be indicated in the claims.

Briefly, instead of using an adhesive to secure the two sections of a transformer or choke core to a PWB, the present mounting assembly includes a special three-piece, snap-together clamp assembly that fixates the core sections to the PWB at the appropriate location in exactly the same way from board to board. The clamp assembly includes a generally U-shaped bracket which receives and supports one core section for positioning against one side of the PWB carrying an associated printed winding. The bracket has arms which extend through cut-outs provided in the PWB for the core sections, those arms projecting appreciably beyond the opposite side of the PWB. The second element of the clamp assembly is an annular substrate of resilient material which is positioned against, and may be adhered to, the other core section of the transformer. When that second core section and the substrate are placed against the opposite side of the PWB between the projecting clip arms, the two core sections are automatically aligned with the cut-outs provided therefor in the PWB, and with each other.

The third component of the clamp assembly is a resilient cover member which clips to the projecting ends of the bracket arms and resiliently engages the second core section so that the two core sections are drawn together with their corresponding core faces in abutment while at the same time compressing the resilient substrate so that the substrate biases the first core section against the side of the PWB containing the associated winding.

Thus the clamp assembly increases the reliability of the circuit on the PWB containing the integrated transformer or choke core. It also permits faster through-put in the manufacturing line for such boards and ensures consistent circuit performance from board to board. Still further, the clamp assembly prevents relative movement of the transformer or choke parts due to vibration and rough handling of the PWB, yet allows the core sections to be separated from the board in the event that becomes necessary for purposes of repair or replacement.

BRIEF DESCRIPTION OF THE DRAWING

For a fuller understanding of the nature and objects of the invention, reference should be made to the following detailed description taken in connection with the accompanying drawing, in which.

DETAILED DESCRIPTION OF AN ILLUSTRATIVE EMBODIMENT

Figure 1:
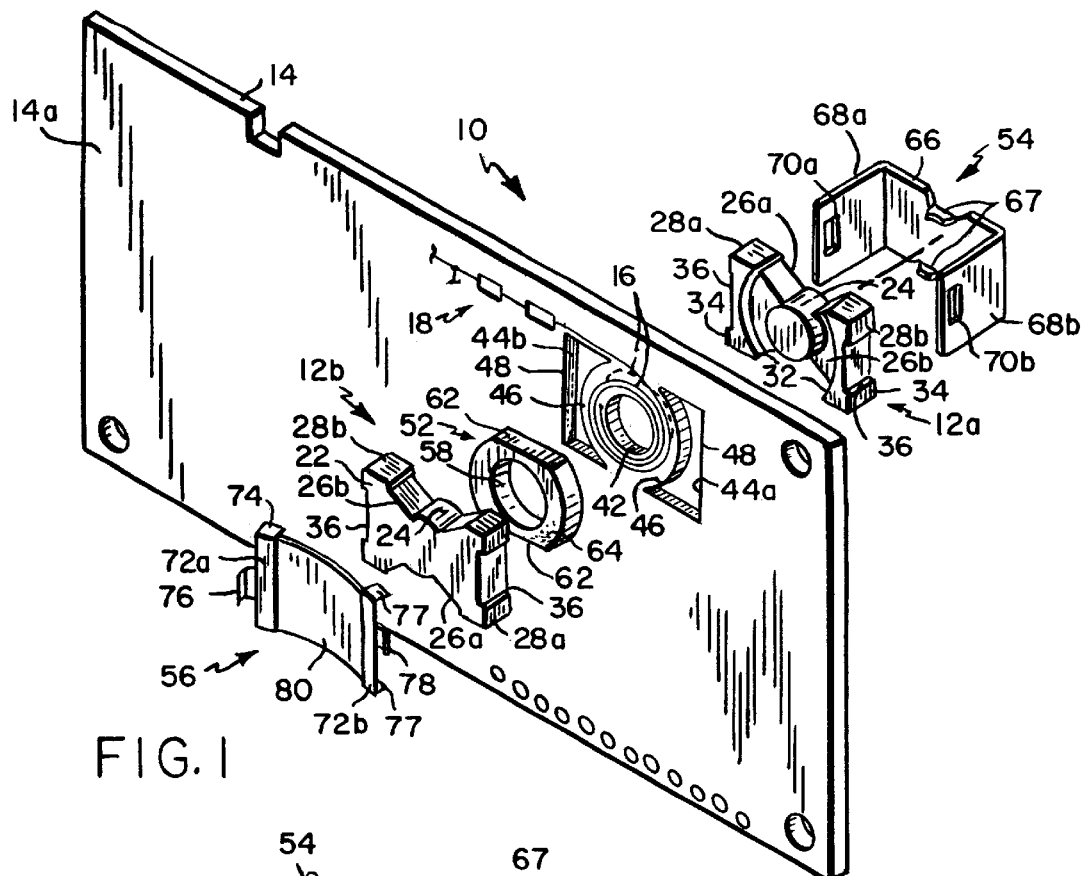
FIG. 1 is an exploded perspective view showing the disassembled components of a core mounting assembly incorporating the invention.

Refer now to FIG. 1 of the drawing which shows generally at 10 a mounting assembly for mounting two mirror image core sections 12a and 12b to a printed wiring board (PWB) 14 having a dielectric substrate 14a. The core sections together form the ferromagnetic core for a choke, a transformer or other inductive component commonly used in electrical circuits. The illustrated core sections 12a and 12b are preferably made of ferrite and they are adapted to be integrated with a winding 16 laid down on one or both sides of PWB substrate 14a. When the two core sections are assembled to PWB 14, they are juxtaposed relative to the winding(s) 16 on the latter so that the totality constitutes a transformer or choke connected in a circuit 18 with other electrical components on PWB 14. For example, PWB 14 may constitute a high performance voltage regulator card for a computer or other electrical apparatus.

As noted above, the core sections 12a and 12b are mirror images of one another. Each has one face 22 which is flat and shaped more or less like an hour glass. This shape is formed by a cylindrical central portion 24 which extends out perpendicular to face 22 and a pair of diametrically opposite, wedge-shaped spokes 26a and 26b radiating out from central portion 24. The spokes are terminated at their radially outer ends by mirror image feet 28a and 28b which are more or less rectangular in shape. As shown in FIG. 1, the central portion 24 and the feet 28a, 28b extend beyond spokes 26a, 26b in the thickness direction toward PWB 14, i.e. they extend farther from the flat face 22 of the core section thereby giving the opposite face of the section a stepped profile. In other words, the faces of spokes 26a, 26b are located in a first plane and the faces of central portion 24 and feet 28a, 28b are located in a second plane, the second plane being spaced farther away from face 22 than the first plane.

Also, we referred to the feet 28a, 28b above as being generally rectangular. By this, we mean that the portion of each foot 28a, 28b that projects towards PWB 14 beyond the adjacent spoke 26a, 26b has a surface 32 which is curved so that it is more or less concentric with the central portion 24. On the other hand, the opposite surfaces 34 of the feet 28a, 28b, constituting the opposite ends of the core section as a whole, are flat and parallel to one another except for the presence of shallow rectangular channels 36 which extend from face 22 to the opposite faces of feet 28a, 28b. In some applications these channels provide clearance for clips which may hold core sections 12a and 12b together when they are located at the edge of a PWB 14.

The core sections 12a and 12b are designed to engage opposite sides of the PWB 14 at winding(s) 16 thereon such that their central portions 24 and their feet 28a, 28b are in register. For this, PWB 14 is formed with cut-outs or through holes to provide clearance for the central portions 24 and feet 28a, 28b of the two core sections 12a, 12b. More particularly, PWB 14 has a circular through hole 42 centered within the winding(s) 16 on the substrate and sized to snugly receive the central portions 24 of the two core sections. Also, spaced from diametrically opposite sectors of hole 42 is a pair of mirror image, generally rectangular windows 44a and 44b which are shaped and arranged to receive the projecting portions of the feet 28a and 28b, respectively, of the two core sections. In other words, windows 44a, 44b have curved radially inner edges 46 which are concentric to hole 42 and straight outer edges 48, those latter edges being parallel.

Still referring to FIG. 1, in addition to the core sections 12a and 12b, the mounting assembly 10 includes a resilient gasket 52, a bracket 54 and a spring cover member 56 which combine in an assembly to clamp the two core sections 12a, 12b to PWB 14 opposite winding(s) 16 in a manner to be described.

Gasket 52, preferably of a heat resistant, fire retardant material, is shaped and arranged to seat against the spokes 26a, 26b of the core section 12b between the central portion 24 and the feet 28a, 28b thereof. For this, gasket 52 is formed as an annulus with a central cylindrical hole 58 and a curved outer edge which conforms to the curvature of the inner walls 32 of the feet 28a, 28b. The upper and lower edges 62 of gasket 52 may be cut straight and parallel to one another so as to conform to the general shape of the associated core section 12b. Preferably, the side of gasket 54 facing core section 12b carries an adhesive 64 so that after removal of a suitable backing strip (not shown), the adhesive side of the gasket may be adhered to the spokes 26a, 26b of core section 12a.

The second element of the clamp assembly, namely bracket 54, is a generally U-shaped member, preferably of spring steel, with a generally rectangular back portion 66 having a pair of relatively small arcuate tabs 67 projecting from the long edges of back portion 66 midway between the ends thereof. Also, a pair of parallel legs 68a and 68b extend in the same direction as the tabs from opposite ends of bracket portion 66. Bracket 54 is dimensioned so that the core section 12a can seat in the bracket with its flat face 22 facing the bracket portion 66 such that tabs 67 engage opposite arcuate sectors of the central portion 24 of that core section and so that the end surfaces 34 of that core section fit between the bracket legs 68a, 68b. As shown in FIG. 1, small, generally rectangular slots 70a, 70b are formed adjacent to the free ends of legs 68a, 68b for reasons that will become apparent.

With the core section 12a seated in bracket 54, that subassembly may be juxtaposed to the PWB 14 so that the central portion 24 and feet 28a, 28b thereof are lined up with the hole 42 and windows 44a and 44b in PWB 14. Then, that section may be placed against the adjacent side of PWB 14 such that central portion 24 and feet 28a, 28b seat in their respective openings in the PWB, it being understood that the substrate windows 44a, 44b are sufficiently wide to also receive the legs 68a, 68b of bracket 54 such that the free ends of those legs project from the opposite side of PWB 14.

The third component of the clamp assembly, namely spring cover member 56, is arranged to interfit with the aforesaid free ends of the bracket legs 68a, 68b. For this, the cover member 56 comprises a pair of generally rectangular end sections 72a and 72b. Section 72a has a pair of small end tabs 74 extending in a first direction from section 72a and a third hook-like tab 76 extending in the opposite direction from the outer edge of section 72a. Likewise, the other end section 72b is provided with end tabs 76 similar to end tabs 74 and a third tab 78 which extends out laterally from the outer edge of section 72b. As will be seen, tabs 76 and 78 are arranged and adapted to engage in the slots 70a and 70b in the legs of bracket 54.

Still referring to FIG. 1, extending between and connecting end sections 72a and 72b of cover member 56 is a generally rectangular bridging section 80. Section 80 is curved or bowed in the same direction as end tabs 74, 76 and it is made of a resilient material such as spring steel. Resultantly, when cover 56 is in its normal unstressed position, the end sections 72a and 72b face away from each other to some extent as shown in FIG. 1.

Figure 2:
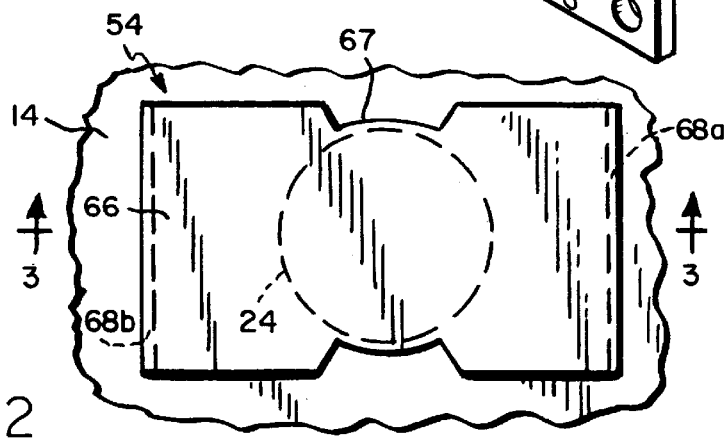
FIG. 2 is a fragmentary top plan view on a larger scale showing the assembly in its assembled condition.
Figure 3:
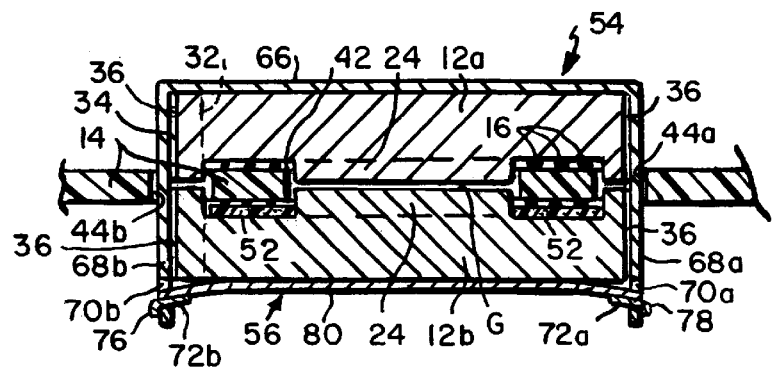
FIG. 3 is a sectional view taken along line 3—3 of FIG. 2.

Referring now to FIGS. 1 to 3, when assembling the components of mounting assembly 10, the core section 12a is seated in bracket 54 such that the tabs 67 engage the central portion 24 of that core section and the bracket legs 68a, 68b engage opposite end surfaces 34 of that core section. Also, the gasket 52 is adhered to the spokes 26a, 26b of the other core section 12b. Then, the legs 68a, 68b of bracket 54 are inserted through the windows 48a and 48b in PWB 14 until the central portion 24 and the feet 28a, 28b of core section 12a seat in the hole 42 and windows 44a, 44b, respectively, in PWB 14. Next, the core section 12b carrying gasket 54 is positioned against the opposite side of PWB 14 such that the central portion 24 and feet 28b, 28a of that core section are seated in the hole 42 and windows 44a, 44b, respectively, in the PWB. Finally, the hook-like tab 76 of the cover member 56 is engaged in slot 70a of the bracket leg 68a projecting through PWB 14 and the end section 72b is swung toward the PWB 14 sufficiently to engage its tab 78 in the slot 70b at the projecting end of bracket leg 68b. That action flexes the bridging portion 80 of cover member 56 from its natural bowed condition shown in FIG. 1 to a more straightened condition illustrated in FIG. 3 wherein that portion 80 presses against the face 22 of core section 12b. Thus, the cover member 56 performs two functions. First, it causes the clamp assembly to clamp the two core sections 12a and 12b to PWB 14 so that their center portions 42 and feet 28a, 28b are in substantial abutment although there may be a small gap G therebetween. Secondly, it compresses resilient gasket 52 between core section 12b and the PWB 14 as shown in FIG. 3 such that the other core section 12a, is biased by the gasket against the winding 16 on the adjacent side of the PWB. Thus, the bracket 54 and cover member 56 supply the required force to keep the two core sections close to one another with a consistent gap G (if any) between them, while the compressible gasket 52 keeps one of the core sections, i.e. core section 12a, pressed against the adjacent winding 16 enabling the combination to perform its intended function as a filter, transformer, choke, etc.

Gasket 52 also isolates the core sections 12a, 12b from sudden movements of the PWB 14 due to vibration of, and shocks to, PWB 14. Still further, the gasket accommodates the inevitable small tolerance variations in the dimensions of the core sections and printed circuit board.

Thus, using the mounting assembly described above, the mating core sections for an inductive element of a circuit can be integrated to a winding on a PWB without any special tools, adhesive or the like. Using the above-described assembly, the two core sections can be automatically positioned properly relative to the PWB and the securement of the cover member 56 to bracket 54 automatically clamps the two core sections together on opposite sides of the PWB and applies the same clamping force from board to board thereby assuring a consistent gap (if any) between the two core sections so that similar circuits on PWBs incorporating the invention have similar characteristics.

It will thus be seen that the objects set forth above, among those made apparent from the preceding description, are efficiently attained. Also, certain changes may be made in the above construction without departing from the scope of the invention. For example, instead of adhering the gasket 52 to the core section 12b, it may be adhered to the PWB 14 in the annular space thereon between hole 42 and windows 44a, 44b. Also, the bridging portion 80 of cover member 56 may be rigid and carry a resilient pad that presses against core section 12b. Therefore it is intended that all matter contained in the above description or shown in the accompanying drawing shall be interpreted as illustrative and not in a limiting sense.

It is also to be understood that the following claims are intended to cover all of the generic and specific features of the invention described herein.

What is claimed is:

1. A core mounting assembly comprising a printed wiring board including a substrate with opposite sides, a first winding on one side and a plurality of through holes extending through the substrate adjacent to the first winding;

a pair of mirror-image core sections positioned against said sides of the board opposite said first winding, said core sections having corresponding portions which project into said through holes;

a bracket having a back portion engaging one of the core sections and at least two legs extending from said back portion through two of said through holes in said board, said legs having free ends;

a resilient cover member having a first end releasably secured to one of said legs, a second end releasably secured to the other of said legs and a bridging portion extending between said first and second ends and pressing against the other of the core sections so as to bias said core sections together, and means for biasing a first of the core sections toward a side of said substrate, said biasing means including a resilient member positioned between said board and the other of the core sections so as to bias said other of the core sections away from the board thereby drawing said one of the core sections towards said winding.

2. The assembly defined in claim 1 wherein the resilient member is disposed opposite the winding.

3. The assembly defined in claim 2 wherein the winding is a spiral winding having a center opening;

one of the through holes is located opposite the winding opening, and said resilient member is an annular gasket.

4. The assembly defined in claim 3 wherein said gasket has an adhesive side adhered to the other of the core sections.

5. The assembly defined in claim 1 wherein said board has second and third through holes bracketing said one of the through holes, and the bracket has a pair of legs extending through the second and third through holes so as to bracket said core sections.

6. The assembly defined in claim 1 and further including a pair of resilient tabs extending from opposite edges of said back portion and resiliently engaging said one of the core sections.

7. The assembly defined in claim 1 and further including a second winding on the other side of said board opposite said first winding.

* * * * *